(12) United States Patent
Wagner et al.

(10) Patent No.: US 7,839,722 B2
(45) Date of Patent: Nov. 23, 2010

(54) MICROFABRICATED ACOUSTIC TRANSDUCER WITH A MULTILAYER ELECTRODE

(75) Inventors: Paul A. Wagner, San Carlos, CA (US); Igal Ladabaum, San Carlos, CA (US); Kathy J. Jackson, Felton, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 216 days.

(21) Appl. No.: 11/903,329

(22) Filed: Sep. 20, 2007

(65) Prior Publication Data

US 2009/0080292 A1 Mar. 26, 2009

(51) Int. Cl.
H04R 19/00 (2006.01)
(52) U.S. Cl. .................................................. 367/181
(58) Field of Classification Search .......... 367/141–190
See application file for complete search history.

(56) References Cited

U.S. PATENT DOCUMENTS

| | | | | |
|---|---|---|---|---|
| 2,929,885 | A * | 3/1960 | Mueller | ...................... 381/175 |
| 5,438,554 | A * | 8/1995 | Seyed-Bolorforosh et al. | .......................... 367/140 |
| 5,982,709 | A | 11/1999 | Ladabaum et al. | |
| 6,246,158 | B1 | 6/2001 | Ladabaum | |
| 6,271,620 | B1 | 8/2001 | Ladabaum | |
| 6,571,445 | B2 | 6/2003 | Ladabaum | |
| 7,087,023 | B2 | 8/2006 | Daft et al. | |
| 2005/0094490 | A1 * | 5/2005 | Thomenius et al. | ......... 367/155 |
| 2005/0177045 | A1 | 8/2005 | Levent et al. | |
| 2005/0200241 | A1 | 9/2005 | Levent | |
| 2005/0203409 | A1 | 9/2005 | Frey et al. | |
| 2007/0153632 | A1 * | 7/2007 | Chang et al. | ................. 367/181 |
| 2008/0259725 | A1 * | 10/2008 | Bayram et al. | .................. 367/7 |

OTHER PUBLICATIONS

Joshua Knight et al. Low Temperature Fabrication of Immersion Capacitive Micromachined Ultrasonic Transducers On Silicon and Dielectric Substrates, 2004, IEEE.*
U.S. Appl. No. 11/502,913, filed Aug. 10, 2006.
Ladabaum, et al., "Surface Micromachined Capacitive Ultrasonic Transducers", IEEE Transactions on Ultrasonics, Ferroelectrics, and Frequency Control, vol. 45, No. 3, May 1998, pp. 678-690.
Knight, et al., "Low Temperature Fabrication of Immersion Capacitive Micromachined Ultrasonic Transducers on Silicon and Dielectric Substrates", IEEE Transactions on Ultrasonics, Ferroelectrics, and Frequency Control, vol. 51, No. 10, Oct. 2004, pp. 1324-1333.
Ergun, et al., "Capacitive Micromachined Ultrasonic Transducers: Fabrication Technology", IEEE Transactions on Ultrasonics, Ferroelectrics, and Frequency Control, vol. 52, No. 12, Dec. 2005, pp. 2242-2258.

(Continued)

*Primary Examiner*—Thomas H Tarcza
*Assistant Examiner*—Luke D Ratcliffe

(57) ABSTRACT

In a capacitive membrane ultrasound transducer, one or more electrodes include multiple layers of conductive or semiconductive material. The layers may be positioned adjacent an insulator or cavity in an arrangement to reduce electrical degradation. For example, a conductive layer with less work function and less resistivity is spaced from an insulator by a conductive layer with more work function and more resistivity. The different layers of electrode material may provide for less electrical degradation due to the type of material used and relative location.

19 Claims, 3 Drawing Sheets

OTHER PUBLICATIONS

Zhuang, et al., "Integration of trench-isolated through-wafer interconnects with 2d capacitive micromachined ultrasonic transducer arrays", Sensors and Actuators A 138 (2007), Elsevier, pp. 221-229.

English translation of German counterpart's Office Action dated Jul. 1, 2009 (German patent application No. 10 2008 046 860.6-54), 3 pages.

* cited by examiner

MICROFABRICATED ACOUSTIC TRANSDUCER WITH A MULTILAYER ELECTRODE

BACKGROUND

The present invention relates to capacitive membrane ultrasonic transducers (CMUTs). In particular, electrode structures are provided for CMUTs.

A typical 1D or 2D ultrasound transducer includes hundreds or even thousands of separate transducer elements. For a CMUT, a plurality (e.g., tens, hundreds, or thousands) of cells may be used together to form a single element.

A cell of a CMUT typically has a void (vacuum gap) covered by a membrane. An electrode is positioned on or within the membrane and another at the base of the void. The electrodes are exposed to the void or may be separated from the void by an electric insulator. To generate acoustic energy, a DC bias and an electrically varying signal are applied across the electrodes, causing the membrane to flex. To generate electrical energy, the acoustically induced flexing of the membrane generates a differential electrical signal between the two electrodes.

Very large electric fields are sustained across the vacuum gaps for the CMUT to generate transmit pressures on par with a piezoelectric transducer. For example, 1.2-1.3 billion volts per meter are required to achieve 1.5 Mega Pascal output pressures at 10 MHz. When exposed to these high electric fields, insulators can lose their insulating properties and begin to leak current. Electrons that pass into the insulator and become trapped or that are emitted from an insulator surface and strike the opposing insulator can alter the electric field in the gap. The altered electric field may degrade CMUT acoustic performance over time.

Historically, attempts to prevent charging degradation over time have focused on CMUTS where, one or both of the insulators are partially or completely removed or not provided. The conductive electrodes are exposed to the cavity. As long as the applied electric field is below the threshold of field emission for the exposed conductive surfaces, these CMUT structures experience less charging degradation over time than insulated CMUTs. However, electrical asymmetry may limit use in bipolar applications. There may be increased shorting between top and bottom electrodes, reducing device yield and raising patient safety concerns.

BRIEF SUMMARY

By way of introduction, the embodiments described below include methods, transducers, and systems for converting between electrical and acoustic energies and forming transducers. One or more electrodes include multiple layers of conductive or semiconductive material. The layers may be positioned adjacent an insulator or cavity in an arrangement to reduce electrical degradation. For example, a conductive layer with less work function and less resistivity is spaced from an insulator by a conductive layer with more work function and more resistivity. Due to the type of material used and relative location, the different layers of electrode material may provide for less electrical degradation over time.

In a first aspect, a membrane ultrasonic transducer is provided for converting between electrical and acoustic energies. A membrane is supported on a substrate. A cavity separates the membrane from the substrate. A first electrode is on an opposite side of the cavity than a second electrode. A first insulation layer separates the first electrode from the cavity. The first electrode has at least two conductive or semiconductive layers in ohmic contact with each other.

In a second aspect, a method is provided for forming a capacitive membrane ultrasound transducer. A flexible structure is formed over a void. Electrodes are formed on opposite sides of the void. A first electrode is adjacent the flexible structure. For forming the at least one of the electrodes, at least two different conductors are layered adjacent an insulating layer.

In a third aspect, a capacitive membrane ultrasonic transducer is provided for converting between electrical and acoustic energies. The transducer has a cavity and a first electrode separated from the cavity by a first insulator. The first electrode is a stack of two or more different conductive or semiconductive films with only one of the two or more different films in predominant physical contact with the insulator within the high field region of the CMUT device.

The present invention is defined by the following claims and nothing in this section should be taken as a limitation on those claims. Further aspects and advantages of the invention are discussed below in conjunction with the preferred embodiment. The aspects or other features discussed herein or below may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

A CMUT structure has at least one multilayer conductor. The multilayer conductor may be separated from a sealed cavity by an insulating film. Such a structure can be either bipolar with top and bottom conductors insulated, or unipolar with just a single insulated conductor. Charging degradation in insulated CMUTs can be prevented or reduced by varying the chemical and electrical properties of the electrodes and electrode-insulator interfaces. For example, different electrode materials are used to provide high work function, low resistivity, low chemical reactivity, and an ability to stick well to a variety of other materials. Since it is uncommon for a single type of material to have all these properties at once, electrodes of two or more conductive or semiconductive layers are provided. Each layer has a subset of the overall desired properties. For the layer in direct contact with the insulator in the high field region of the CMUT, a material with a high work function is used to prevent electrons from being thermally or quantum mechanically injected into the insulator and leading to charging degradation. For the second layer, a material with low resistivity is chosen to limit element parasitic series resistance. A third layer may or may not be added for adhesion or to serve as a diffusion barrier.

The multilayer electrode CMUT structure is able to generate higher output pressures more reliably, without requiring the removal of one or both insulators. In addition, the bias applied to the cells may be repeatedly inverted, removed, or otherwise changed without an associated build-up of trapped charge in the insulating films. This can lead to improved contrast resolution imaging capability in dynamic bias imaging schemes, since such schemes often require one or more cells to be periodically deactivated through removal of the applied bias. For the zero-bias sections to be truly inactive and not contribute acoustic energy to side lobes, the insulators are free of trapped charge.

Figure 1:
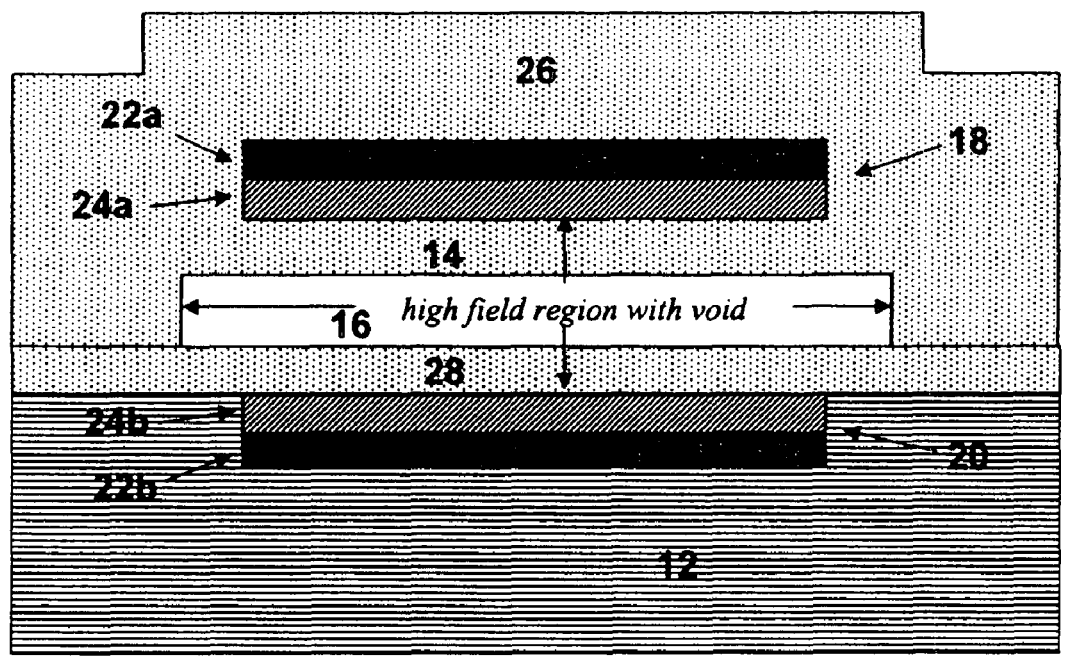
FIG. 1 is a cross-sectional side view of one embodiment of a CMUT cell with layered electrodes.

FIG. 1 shows a membrane ultrasonic transducer for converting between electrical and acoustical energies. The membrane ultrasonic transducer is a capacitive membrane ultrasonic transducer (CMUT) in one embodiment. Membrane is used broadly to include flexible planks or other flexible structure as well as membranes of a drum for transducing between electrical and acoustical energies. The membrane ultrasonic transducer includes a substrate 12, a membrane 14 disposed over a void 16, an electrode 18 adjacent to the membrane 14, a bottom electrode 20, an insulator 28, and a cover layer 26. Other now known or later developed CMUT structures may be provided. Additional, different or fewer components may be provided.

The cell shown in FIG. 1 has a bipolar structure. If the electric potential is reversed between the electrodes 18, 20, the same structure is provided relative to the electrodes 18, 20. There is structural symmetry. The electrodes 18, 20 are separated from each other by insulators (membrane 14 and insulator 28) and the void 16. In alternative embodiments, the cell has a unipolar structure. For example, the insulator 28 is not provided. The bottom electrode 20 is exposed to the void 16 while the membrane 14 insulates the other electrode 18 from the void 16. As another example, the membrane 14 is doped or formed as the top electrode 18 without a further insulator or the electrode 18 is on an opposite side of the membrane 14, exposing the electrode 18 to the void 16.

Different cells may be interconnected by an electrode interconnect, such as disclosed in U.S. Pat. Nos. 6,271,620 and 6,571,445, the disclosures of which are incorporated herein by reference. The electrodes 18, 20 and corresponding layers 22, 24 connect with interconnects to one or more other cell electrodes. The interconnect may be on a same layer or be an additional layer on the electrodes 18, 20.

The CMUT cell includes the substrate 12. The substrate 12 is a semiconductor, such as silicon, silicon with layers of additional material, gallium arsenide, or other now known or later developed microfabrication materials. The substrate 12 is sized as a rectangular or other shaped slab sufficient to provide a desired number of transducer elements. For example, a linear, narrow slab is provided for a one-dimensional transducer array, and a wide slab is provided for a multi-dimensional transducer array. While additional substrate 12 may be used for signal routing, pads for wire bonding or other structures, the area of the substrate 12 is kept as small as possible.

The membrane 14 is a semiconductor or other material supported on the substrate 12. For example, the membrane 14 is formed as a layer of plasma-enhanced chemical vapor deposition silicon nitride, but any other now known or later developed materials may be used. The membrane 14 is formed through patterning, etching, and use of a sacrificial layer, such as aluminum or a low temperature oxide or glass. By removing the sacrificial layer, the void 16 associated with each membrane 14 is formed. A via with associated etching, photoresist process or other processes is then used to remove the sacrificial layer or portions of the layer remaining after patterning to form the void 16. The void 16 may be sealed or left with an opening. For example, an additional layer of material is deposited to fill the via in one embodiment, but the via may be unfilled in other embodiments. The void 16 forms a cavity separating the membrane 14 from the substrate 12.

As shown in FIG. 1, the membrane 14 is on a top surface of the substrate 12. Top surface as used herein includes the membrane layer being exposed on the top surface, the membrane 14 and additional layers deposited over the membranes being exposed on the top surface or other general placement of the membrane 14 to receive acoustic energy from the top surface. In alternative embodiments, the membrane 14 is spaced from the top surface, such as by layers of other voids and associated membranes.

The membrane 14 provides an insulation layer separating the electrode 18 from the void 16. Any electrical insulating material may be used, such as silicon nitride. Other insulation layers may be provided, such as a layer separate from or only part of the membrane 14. The membrane 14 or other insulation layer separates the electrode 18 from the void 16. For a unipolar structure, the top electrode 18 is exposed to the void 16 without intervening insulation. Only a portion or the entire membrane 14 provides the insulation layer.

For the lower electrode 20, the insulation layer 28 is deposited or formed over the electrode 20. Any electrical insulating material may be used, such as silicon nitride. The insulation layer 28 is on a side of the void 16 opposite the membrane 14. The insulation layer 28 separates the electrode 20 from the void 16. For a unipolar structure, the bottom electrode 20 is exposed to the void 16 without intervening insulation.

The electrodes 18, 20 are thin deposits of metal, but other conductors or semiconductors may be used, such as indium oxide or conductive polymers. Any of sputtering, doping, low or high temperature deposition, wafer bonding, or other processes may be used to form the electrodes 18, 20. For example, the electrodes 20 within the void 16 are deposited, etched, patterned or otherwise formed prior to depositing a sacrificial layer for the void 16 and a layer for forming the membranes 14. As another example, the electrodes 18 are patterned, deposited and etched or otherwise formed after forming the membranes 14 and before or after removing the sacrificial layer to form the voids 16. Each electrode 18, 20 is associated with the void 16 and membrane 14.

The electrodes 18, 20 are on opposite sides of the void 16. For example, the electrode 18 is a metalized layer covering a portion of the membrane 14, such as a common patterned layer covering cells for an entire CMUT element. Alternatively, conductors or electrical traces connect each of the separate top electrodes 18 onto a single signal or ground path. Electrodes from different elements may be connected together as a constant reference, such as a connection with ground. Some electrodes 18, 20 are separate or electrically isolated from electrodes 18, 20 from other elements 24. At least one electrode of each membrane 14 for a given element 24 is kept separate from an electrode of another element 24. In one embodiment, the top electrodes 18 act as grounding electrodes and may be common to one or more elements, but in other embodiments, the lower electrode 20 operates as the grounding electrode.

One or both of the electrodes 18, 20 are formed as a stack or arrangement of two or more different conductive or semiconductive films. FIG. 1 shows both electrodes 18, 20 including two contacting layers 22, 24. Additional layers may be provided, such as an adhesive layer between the layers 22, 24 or between the layer 22 spaced from the insulator 28, 14 and other material. "Contacting" provides for electrical contact, such as associated with two conductors in direct physical contact or other electrical contact. The layers 22, 24 in the electrode 18, 20 are in ohmic contact with one another. The layers 22, 24 are wholly overlapping to reduce parasitics, but may not be wholly overlapping. Partial overlapping or vertical separation from each other in places by an insulator may be provided. A third layer between the two conductive layers 22, 24 may be non-conductive. This third layer can serve as an adhesion layer, a diffusion barrier, or a mechanical separator, which vertically positions the two conductor layers 22, 24 within the suspended membrane 14 in a way that distributes film stress or other material properties in a favorable way. In the case of a mechanical separator, the third layer can be an insulator or even part of the membrane 14.

The layers 22, 24 are separate materials. In an alternative embodiment, an alloy or blended electrode structure of the different materials may be provided. For example, the conductive layers 22, 24 may be partially alloyed together near their interface (i.e., there may be a transition region between the two conductors that consists of an alloy of the two). The desired separation of electrical characteristics is provided by grading the amount of one material relative to the other material as a function of depth. The grading provides different layers.

One layer 24 contacts the insulation layer 28, 14. The layer 24 predominantly contacts with the insulation layer 28, 14 in those regions where the insulation layer 28, 14 is adjacent to a void 16 with high electric fields. The layer 24 may bond to, connect with, stick to, adhere to, or otherwise be held in place against the insulation layer 28, 14.

The layer 24 separates the other layer 22 from the insulation layer 28, 14 in the high field region of the CMUT. For example, only the layer 24 is directly adjacent to the insulation layer 28, 14 and the other layer 22 or layers are completely, predominantly, or mostly free of contact with the insulation layer 28, 14 in the high field region.

One or more contacts or through connections may be provided in other embodiments. For example, the low work function conductor layer 22 may touches portions of the insulator 28, 14 in areas where the insulator 28, 14 is no longer adjacent to the vacuum void 16 or the opposite electrode 18, 20 has been discontinued. In regions with only a single electrode 18, 20 adjacent to the void 16, the electric field is low enough that charging degradation may not be a problem. In regions with opposing electrodes but no void 16, the electric field is high but trapped charge does not affect the transducer's acoustic performance.

In regions of the CMUT with two electrodes 18, 20 on opposite sides of the void 16, the adjacent insulator 28, 14 is predominantly in contact with the high work function conductor layer 24 and not the other layer 22. This may prevent charging from hurting the acoustic performance of the transducer. Nevertheless, it is permissible for the low work function metal to touch the insulator 28, 14 over a limited area (e.g., <10%) of this high field-overlapping region. In such a case, 10% of the device will charge severely, while 90% is unaffected, resulting in a relatively minor overall degradation in acoustic performance.

Figure 3A:
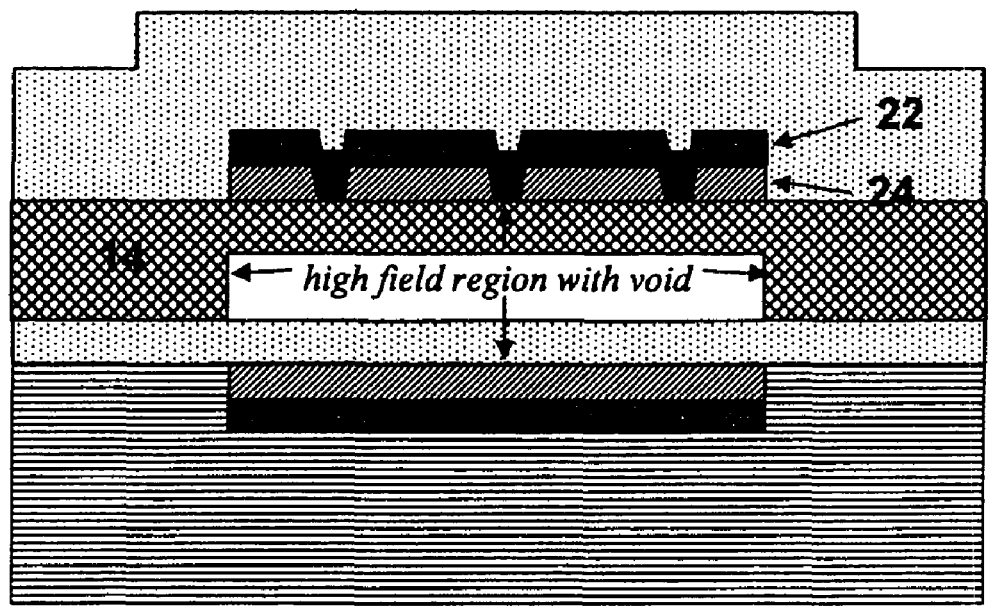
FIGS. 3A-D show alternative embodiments of the CMUT cell with layered electrodes.
Figure 3B:
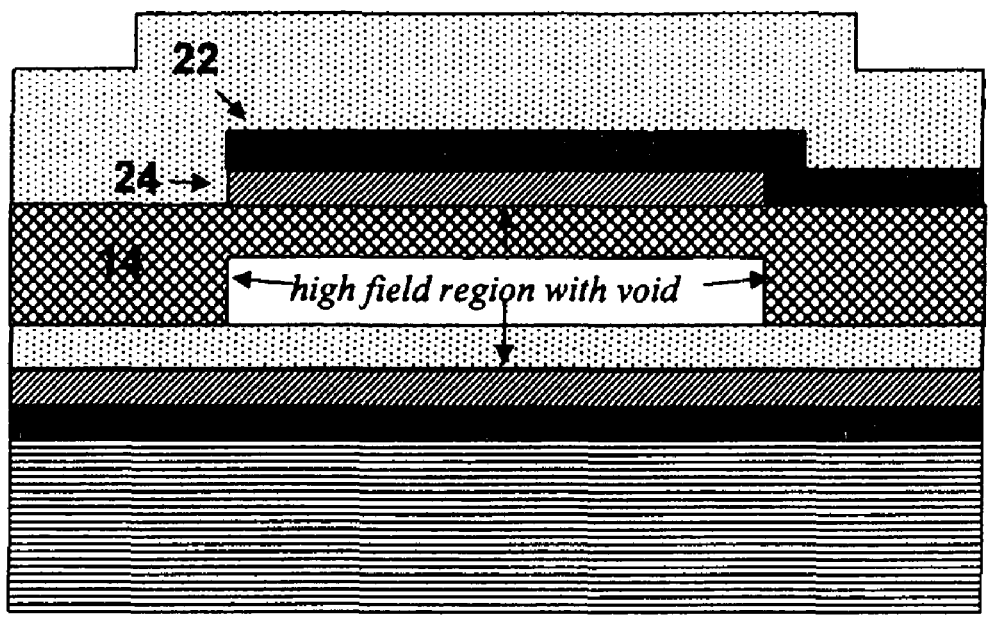
Figure 3C:
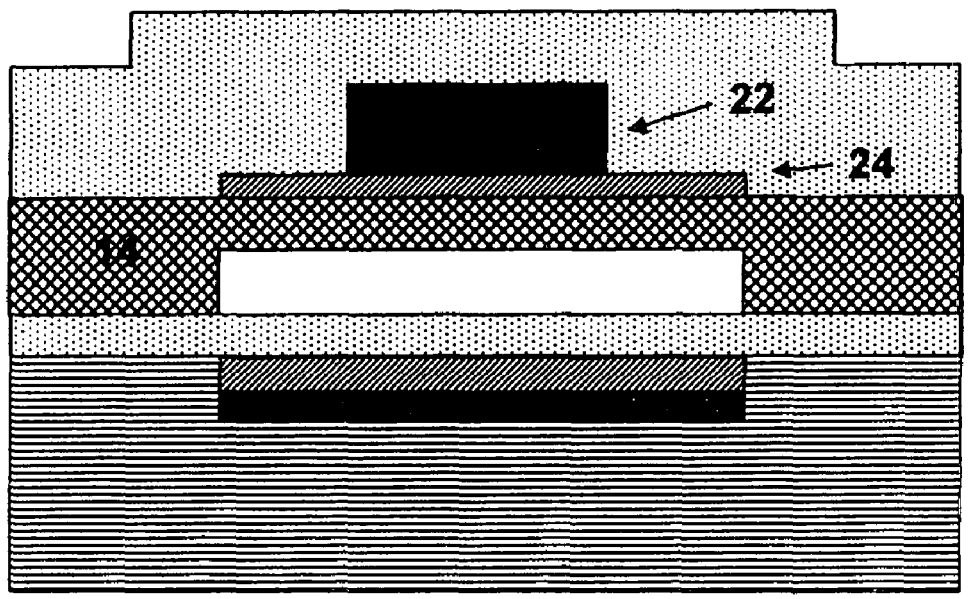
Figure 3D:
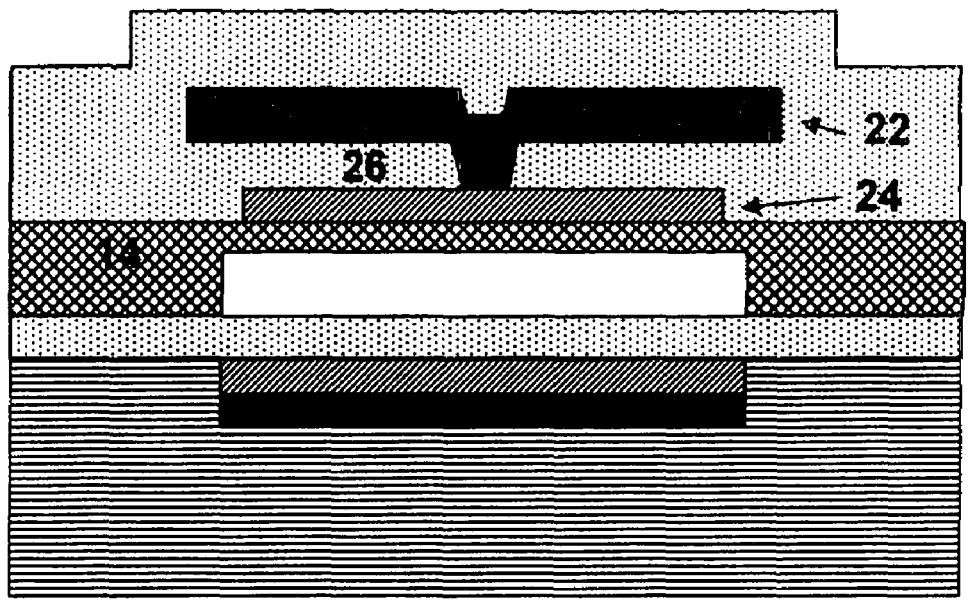

FIGS. 3A-D show different embodiments of the CMUT cell with different levels or types of contact and separation. FIG. 3A shows the layer 22 contacting the insulator 14 in the high field region through grooves or holes in the layer 24. FIG. 3B shows the layers 22, 24 not completely overlapping outside the higher field region in the void 16. FIG. 3C shows the layer 22 being narrower than the layer 24. FIG. 3D shows a separation between portions (e.g., most) of the layers 22, 24. Other arrangements of overlap, separation, and/or contact may be provided.

The layers 22, 24 may have different thicknesses. For example, the layer 24 adjacent the insulator 28, 14 or the void 16 has a thickness equal to or less than the thickness of the other layer 22. Any thickness may be provided, such as less than 2 micrometers. In one embodiment, all four conductors of the layers 22, 24 in the two electrodes 18, 20 have different thicknesses. For the CMUT to be bipolar, it is not required that the conductive layers 22, 24 on opposite sides of the void 16 have matched thicknesses. The layers 22, 24 may have the same thickness between electrodes 18, 20 and/or within an electrode 18, 20. In one embodiment, each layer 22, 24 is less than 0.5 micrometers. Greater or lesser thicknesses of the layers 22, 24 may be used.

The layer 24 adjacent the insulator 28, 14 has a higher work function and/or a higher resistivity than the layer 22 spaced from the insulator 28, 14. For example, the layer 24 has a work function greater than or equal to 4.5 eV, and the layer 22 has a resistivity equal to or less than $3e^{-8}$ Ohm-cm. The difference in work function and/or resistivity between the layers 22, 24 may provide for desired avoidance or limiting of electrical degradation. The higher work function adjacent the insulation layer 28, 14 avoids or limits electron migration. The lower resistivity of the layer 22 spaced from the insulation layer 28, 14 may limit parasitic series resistance. The layers 22, 24 may be designed to provide other characteristics, such as low chemical reactivity, lower residual stress, and/or the ability to stick to other layers. The ability to stick may avoid delamination. In one embodiment, the layer 24 has a nominal stress greater than 400 MegaPascal tensile, and the other layer 22 has a nominal stress less than or equal to that of the layer 24.

The materials used to form the layers 22, 24 provide the desired characteristics. For example, the layer 24 adjacent to the insulation layer 28, 14 includes tungsten, tungsten alloy, chrome, nickel, cobalt, beryllium, gold, platinum, or palladium. Alloys or other materials having one or more of these materials as components may be used. Different materials may be used. As another example, the layer 22 spaced from the insulation layer 28, 14 is aluminum, aluminum alloy, poly-silicon, or copper. Alloys or other materials having one or more of these materials as components may be used. Different materials may be used.

In one configuration, a unipolar CMUT structure without multi-layer electrodes 18, 20 may be provided. For example, an AlCu (aluminum-copper) upper electrode is 0.25 um thick. A silicon nitride upper insulator is 0.8 um thick. The vacuum cavity is 0.1 um thick. There is no lower insulator. An exposed TiW (Titanium-Tungsten alloy) lower electrode is 0.25 um thick. Charging degradation of this unipolar structure may be low in a "good" electric field polarity, but severe in the polarity where the exposed metal is induced to emit electrons into the vacuum cavity. Charging degradation results when these electrons are accelerated to high energies by the electric field and crash into the opposing insulator. If the bias voltage may have a changing polarity or in response to a bipolar alternating signal, the unipolar structure may be subject to charging degradation effects.

A bipolar CMUT structure may have single layer electrodes. For example, an AlCu (aluminum-copper) upper electrode is 0.5 um thick. A PECVD silicon nitride upper insulator is 0.45 um thick. The vacuum cavity is 0.1 um thick. A PECVD silicon nitride lower insulator is 0.45 um thick. An AlCu (aluminum-copper) lower electrode is 0.25 um thick. For demonstrating charging degradation, the magnitude of an applied electric field is linearly ramped up from a zero value to 2 GV/m over an eight-hour period. The polarity of the applied field is reversed once every 2 seconds, creating an alternating field condition in the void. This bipolar structure may suffer from significant charging degradation in both polarities. The charging degradation may be improved by selection of different electrode materials, but such materials may be too resistive, have elevated tensile stresses, and/or have problems with delamination during fabrication.

In one embodiment, a bipolar CMUT structure may have multilayer electrodes. An upper electrode includes a layer spaced from an insulator of AlCu at 0.25 um thick and a layer adjacent the insulator of W at 0.25 um thick. The upper insulator is PECVD silicon nitride at 0.45 um thick. The vacuum cavity is 0.1 um thick. The lower insulator is PECVD silicon nitride lower insulator at 0.45 um thick. The lower electrode includes a layer adjacent the lower insulator of W at 0.25 um thick and a layer spaced from the lower insulator of AlCu lower electrode at 0.25 um thick. No or litter charging degradation may be provided in response to the same voltage.

The CMUT with multilayered electrodes may be used for any desired therapy or imaging application. For example, the CMUT provides for integrated beamforming, allowing use as a multi-dimensional array (e.g., 2D array). Volumetric imaging with a small transducer may be provided, such as for breast imaging. As another example, a one-dimensional array is formed with the CMUT. The transducer may maintain time-invariant acoustic sensitivity over its operational life.

Any now known or later developed technique may be used for forming the CMUT, membranes 14, electrodes 18, 20, and substrate 12. CMOS or bipolar processing is used in one embodiment. Using spin deposition, sputter deposition, vapor deposition, other forms of deposition, wafer bonding, etching, patterning, lapping, evaporating, scribing, photolithographic patterning, or other now known or later developed techniques, the various layers, structure, and materials of the CMUT are formed. Semiconductor, insulating, and conducting layers are formed as part of or on the substrate 12.

Figure 2:
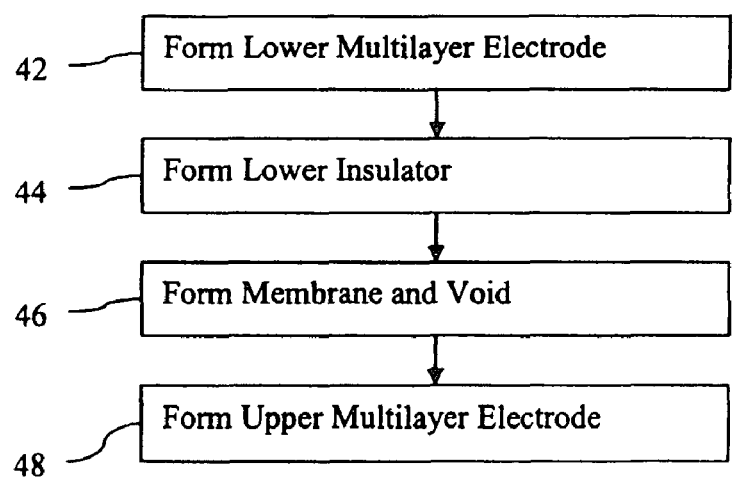
FIG. 2 is a flow chart diagram of one embodiment of a method for forming a CMUT with multi-layered electrodes.

FIG. 2 shows a flow chart of one embodiment of a method for forming a capacitive membrane ultrasound transducer. Additional, different or fewer acts may be provided. In other embodiments, the acts are provided in a different order. FIG. 2 shows forming a bipolar structure, but unipolar structures may be formed by different positioning of electrodes and/or not forming an insulation layer. Both electrodes are multilayered, but one of the electrodes may have a single layer.

In act 42, a lower multilayer electrode is formed within or on a semiconductor substrate. Using CMOS, bipolar, or another microfabrication technique, an electrode with multiple layers is formed. The layers are deposited, etched, patterned, spun, lapped, and/or otherwise formed for each cell. At least two different conductors or semiconductors are layered. The substrate is doped in one embodiment to provide one of the layers. Alternatively, different metal layers or other conductors are stacked on or in the substrate.

The layers are formed to provide different characteristics for minimizing charging degradation and optimizing electrode performance. For example, a bottom layer is a conductor having a lower resistivity than a conductor of the top layer. The top layer separates the bottom layer from the insulating layer and/or void. The top layer has a higher work function than the bottom layer.

In act 44, a lower insulator is formed. The lower insulator is silicon nitride, but may be other materials. Using CMOS, bipolar, or other microfabrication technique, the lower insulation layer is formed. For example, silicon nitride is deposited, etched, patterned, spun, lapped, and/or otherwise formed over the top layer of the lower multilayer electrode. In alternative embodiments, a lower insulation layer is not provided.

In act 46, a flexible structure is formed over a void. The flexible structure is a membrane, beam, post, or other structure. The void may be formed as part of the acts for forming the flexible structure. Any now known or later developed CMOS, bipolar, or microfabrication process may be used for forming the membrane and void. For example, a sacrificial layer is deposited on top of the lower insulation layer. The sacrificial layer is then patterned to leave sacrificial material at the locations of desired voids. Silicon, silicon nitride, or other semiconductor material is then deposited over the sacrificial layer, any exposed electrical interconnections and onto any exposed surfaces of the original substrate. Using vias or other structures, the sacrificial layer is removed, resulting in the membrane and the void.

In act 48, an upper electrode is formed on an opposite side of the void from the lower electrode. The upper electrode is formed adjacent to the flexible structure, such as on top, on bottom, or in a membrane. Any now known or later developed CMOS, bipolar, or microfabrication process may be used for forming the upper electrode. At least two different conductors are layered adjacent an insulating layer. One of the layers separates the other layer from the flexible structure or other insulation layer. The flexible structure is also an insulation layer, but a separate insulation layer may be provided. The insulation separates the layers of the upper electrode from the void. The layer immediately adjacent the flexible structure has a higher work function and a higher resistivity than the layer spaced from the flexible structure.

Other processing may be provided. For example, one or more layers of polymer or other insulator 26 are formed over the top surface of the substrate and the upper electrode. Any of various now known or later developed polymers or insulators may be used, such as polymers used to form acoustic matching layers with or without acoustic filler. The polymer layer acts as an insulator as well as an acoustic matching layer. The polymer is deposited using a photoimagable resist, lithographic spinning, CVD or other technique to form thin layers. As an alternative to polymer, a semiconductor insulator or other electrically insulating material may be used.

Another process includes forming electrical interconnections between cells and/or elements of a transducer array. Using any of the various routing or electrical connection techniques (e.g., forming metal traces, vias, or doping), the electrodes associated with membranes or elements are connected together. Flip chip bonding, wire bonding, flexible circuit connection, or other connection connects the elements to receiver and transmitter electronics. In one embodiment, the receiver electronics are integrated within the same substrate. Alternatively, the receiver electronics are positioned adjacent to the substrate or spaced from the substrate. For example, the receiver electronics are integrated within a separate substrate and bonded to a bottom or side of the substrate used for the CMUT. Electrical connections between the two substrates are then provided using an edge conductor, conductors within the CMUT substrate, conductors within polymer layers above the CMUT substrate, wire bonds, flex circuits, or combinations thereof. As an alternative to connection to the receiver electronics, the conductors described above connect with a cable for a remote connection to the electronics. Any of the various techniques described above can be used either for a common or ground electrode configuration or for element-based signal electrode configurations.

Additional shielding may be incorporated or integrated into some or all of the layers discussed herein. For example, an electrically separate metal film is connected to ground or allowed to float as an EMI shield within the substrate 12 beneath the bottom electrode 20.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A membrane ultrasonic transducer for converting between electrical and acoustic energies, the transducer comprising:
   a substrate;
   a membrane supported on the substrate, a cavity separating the membrane from the substrate;
   first and second electrodes, the first electrode on an opposite side of the cavity than the second electrode; and
   a first insulation layer separating the first electrode from the cavity;
   wherein the first electrode comprises at least two conductive or semiconductive electrode film layers in ohmic contact with each other;
   wherein the at least two electrode film layers of the first electrode comprise a first film layer and a second film layer, the first film layer contacting the insulation layer and having a higher resistivity than the second film layer.

2. The transducer of claim 1 wherein the first insulation layer comprises the membrane.

3. The transducer of claim 1 wherein the first insulation layer is on a side of the cavity opposite the membrane.

4. The transducer of claim 3 further comprising:
   a second insulation layer comprising the membrane;
   wherein the second electrode comprises at least two conductive or semiconductive electrode film layers in ohmic contact with each other.

5. The transducer of claim 1 wherein the first film layer is predominantly in contact with the insulation layer in those regions where the insulation layer is adjacent to the cavity with high electric fields and having a higher work function than the second film layer.

6. The transducer of claim 1 wherein the first film layer has a work function greater than or equal to 4.5 eV, and the second film layer has a resistivity equal to or less than $3e^{-8}$ Ohm-cm, the second film layer having a lower work function than the first film layer.

7. The transducer of claim 1 wherein the first film layer has a nominal stress greater than 400 MegaPascal tensile, and the second film layer has a nominal stress less than or equal to that of the first film layer.

8. The transducer of claim 1 wherein the first film layer comprising tungsten, tungsten alloy, chrome, nickel, cobalt, beryllium, gold, platinum, palladium, or material having one or more thereof, the second film layer comprising aluminum, aluminum alloy, poly-silicon, copper, or material having one or more thereof.

9. The transducer of claim 1 wherein the first film layer predominantly in contact with the insulation layer in regions adjacent to the cavity with high electric fields, and the second film layer predominantly free of contact with the insulation layer in those regions.

10. The transducer of claim 1 wherein the first film layer predominantly in contact with the insulation layer and having a first thickness less than or equal a second thickness of the second film layer.

11. A method for forming a capacitive membrane ultrasound transducer, the method comprising:
    (a) forming a flexible structure over a void; and
    (b) forming electrodes on opposite sides of the void, a first electrode adjacent the flexible structure, wherein forming at least one of the electrodes comprising layering at least two different conductors adjacent an insulating layer;
    wherein a first of the at least two different conductors has a lower resistivity than a second of the at least two different conductors, the second conductor separating the first conductor from the insulating layer in regions adjacent to the void, the second conductor having a higher work function at a conductor-insulator interface than the first conductor.

12. The method of claim 11 wherein the insulating layer is the flexible structure, the insulating layer separating the at least two different conductors from the void; and
    wherein forming electrodes comprises forming both electrodes, each with the at least two different conductors.

13. In a capacitive membrane ultrasonic transducer for converting between electrical and acoustic energies, the transducer having a cavity and a first electrode separated from the cavity by a first insulator, an improvement comprising:
    the first electrode comprising a stack of two or more different conductive or semiconductive films with only one of the two or more different films predominantly in contact with the adjacent insulator in a high field region adjacent to the cavity;
    wherein a first of the films has a lower resistivity and work function than a second of the films, the second of the films being the one of the films predominantly adjacent the insulator.

14. The improvement of claim 13 wherein the transducer is unipolar.

15. The improvement of claim 13 wherein the transducer in bipolar.

16. The improvement of claim 13 wherein the first film has a resistivity of $3e^{-8}$ Ohm-cm or less and the second film has a work function of 4.5 eV or greater.

17. The improvement of claim 13 wherein the first film comprises aluminum, aluminum alloy, poly-silicon, or copper and wherein the second film comprises tungsten, tungsten alloy, chrome, nickel, cobalt, beryllium, gold, platinum, or palladium.

18. The improvement of claim 13 wherein a first thickness of the first film is greater than or equal a second thickness of the second film, the first and second thicknesses being less than 2 micrometers.

19. The improvement of claim 13 wherein the first film has a nominal stress greater than 400 MegaPascals tensile, and wherein the second film has a nominal stress less than or equal to 400 MegaPascals tensile.

* * * * *